United States Patent
Erdman

(10) Patent No.: US 8,690,597 B2
(45) Date of Patent: Apr. 8, 2014

(54) COMPLIANT CONTACT PLATE FOR USE IN TESTING INTEGRATED CIRCUITS

(75) Inventor: Joel N. Erdman, Waconia, MN (US)

(73) Assignee: Johnstech International Corporation, Minneapolis, MN (US)

( * ) Notice: Subject to any disclaimer, the term of this patent is extended or adjusted under 35 U.S.C. 154(b) by 48 days.

(21) Appl. No.: 13/456,964

(22) Filed: Apr. 26, 2012

(65) Prior Publication Data

US 2012/0282799 A1 Nov. 8, 2012

Related U.S. Application Data

(60) Provisional application No. 61/481,404, filed on May 2, 2011.

(51) Int. Cl.
*H01R 13/64* (2006.01)
(52) U.S. Cl.
USPC .......................... 439/374; 439/264; 439/525
(58) Field of Classification Search
USPC ......... 439/374, 264, 246, 268, 330, 525, 526, 439/331, 247
See application file for complete search history.

(56) References Cited

U.S. PATENT DOCUMENTS

| | | | | |
|---|---|---|---|---|
| 7,548,422 | B2 * | 6/2009 | Hsieh | 361/695 |
| 7,753,704 | B2 * | 7/2010 | Chen | 439/268 |
| 7,828,576 | B2 * | 11/2010 | Lin et al. | 439/331 |
| 8,057,242 | B2 * | 11/2011 | Hsu et al. | 439/73 |
| 8,096,822 | B2 * | 1/2012 | Chen et al. | 439/330 |
| 2007/0259543 | A1 * | 11/2007 | Hsieh | 439/73 |
| 2010/0311264 | A1 * | 12/2010 | Chen et al. | 439/330 |
| 2011/0104927 | A1 * | 5/2011 | Wang et al. | 439/330 |

* cited by examiner

*Primary Examiner* — Hae Moon Myeon
(74) *Attorney, Agent, or Firm* — Altera Law Group, LLC

(57) ABSTRACT

A floating or compliant plate test socket device and method is disclosed. Three primary components, a fixed frame (20) receives a floating or compliant plate (22), sit together atop a housing (24) which contains contact pins used for the electrical test of the DUT (device under test). In fixed plate (20) are bearings for reducing friction when the floating plate is driven downward by the DUT inserter. Embedded in sidewalls (40) are a plurality of vertical raceways (46) which receive bearings (48). The raceways are borings, which have gap in the boring, in the fixed plate sidewalls (40) with the boring center spaced from the sidewall sufficiently that part of the bore removes part of the sidewall but allows the ball bearings to partially protrude from the gap formed in the incomplete semicircular boarding without the bearings being able to freely escape.

9 Claims, 12 Drawing Sheets

COMPLIANT CONTACT PLATE FOR USE IN TESTING INTEGRATED CIRCUITS

CROSS-REFERENCE TO RELATED APPLICATION

This application claims priority of provisional application No. 61/481,404, filed on 2 May 2011, which hereby is incorporated herein by reference in its entirety.

BACKGROUND OF THE INVENTION

1. Technical Field

The present invention is directed to testing equipment for testing integrated circuits before installation onto circuit boards.

2. Background

Testing microcircuits before soldering them onto circuit boards is essential to making products with a low failure rate. Defective microcircuits are difficult or impossible to remove from a circuit board, so installing a defective microcircuit typically requires scrapping the entire circuit board. In general, testing of an individual microcircuit involves temporarily connecting test contacts to the microcircuit terminals, and then using special test circuitry connected to the test contacts to operate the microcircuit to test the microcircuit functions.

Microcircuits are provided in a number of different package types. The means for connecting test contacts to a particular type of microcircuit depends on the type of package enclosing the microcircuit and the type of contacts carried by the package. Of course, making good contact between every one of the test contacts and the associated microcircuit terminal is very important, since a bad test connection to even one microcircuit terminal will indicate the microcircuit as defective even though the microcircuit may in fact be fully functional.

The type of package of interest is a leaded microcircuit or integrated circuit (IC) package. Another is leadless which has small connector pads along the edges of one face form solder terminals by which the package is electrically and mechanically connected to the circuit board. Internal wiring connects the internal microcircuit to the solder terminals. Hereafter the term "package" will refer to both leaded and leadless packages unless otherwise stated or the context clearly indicates otherwise. Further, the microcircuit under test is conventionally referred to as the "DUT", that is, device under test.

To test such ICs, a test socket is built for that particular lead configuration and shape. An insert (generally a robot) will pick an IC part from a bin, oriented more or less correctly for insertion and then insert it into the test socket.

This operation happens quickly and not necessarily under ideal conductions. Alignment of the inserter and socket are not always perfect or the alignment force is outside of specification.

Misaligned insertions or improper force can destroy either test socket, its contact pins, the IC or all of the above. Further, damage caused by one bad insertion can leave behind debris which destroys or mis-tests subsequent ICs.

Therefore it is important to find ways to compensate for inserter errors.

BRIEF SUMMARY

To assist the reader in preparing to digest the detailed description and claims below, a short summary has been provided. It is far from complete and only provides a glimpse of the invention concepts. It is not intended to define the scope of the invention. The claims perform that function.

For example, a compliant or floating plate test socket for testing microcircuit devices under test (DUT) is disclosed, comprising:
  a. a fixed housing having a central aperture, generally 20A in FIG. 1 and sidewalls bounding said aperture;
  b. a floating plate sized to be received at least in part by said central aperture and having at least two opposing sidewalls having mating surfaces which mate with like sidewalls of said aperture;
  c. friction reducing elements in either of said sidewalls to enhance slideability between said plates said elements comprising:
    1. at least one bore in the sidewall of either the fixed housing or the floating plate,
    2. a least one bearings in said bore,
  d. at least one bias element engaging said floating plate to bias said plate upwardly toward said fixed plate.

Also disclosed is a socket wherein said bore extends only partly into the mating surface so that the bore forms a discontinuous gap on the mating surface so that the bearing protrudes partly beyond the bore.

Also disclosed is a socket wherein said bore forms a semicircular opening in the mating surface.

Also disclosed is a socket wherein said bore forms a semicircular opening in the mating surface which comprises less than one half of the bore, so that the bearings are retained in the bore but may contact an adjacent mating surface.

Also disclosed is a socket wherein said bore forms a semicircular opening in the mating surface which comprises generally 30-49% of the bore, so that the bearings are retained in the bore but may contact an adjacent mating surface.

Also disclosed is a socket including a bearing stop element in said bore to retain the bearing.

Also disclosed is a socket wherein said bearing stop includes an elastomeric material which intersects the bore so that the bearings are retained in the bore.

Also disclosed is a socket wherein the bearing stop includes a pair of elasteromeric members which intersect the bore from different sides to retain the bearings in the bore.

Also disclosed is a socket wherein the floating plate includes a plurality of further chamfered sidewalls for guiding the DUT into position during insertion.

Also disclosed is method of absorbing the shock of insertion of a microcircuit device under test (DUT) when inserted into a DUT tester having a fixed housing having a central aperture and sidewalls bounding said aperture; a floating plate sized to be received at least in part by said central aperture and having at least two opposing sidewalls having mating surfaces which mate with like sidewalls of said aperture; comprising the steps of:
  locating friction reducing elements in each sidewall between sidewalls of the housing and plate;
  locating spring bias elements under the floating plate,
so that a DUT inserted into the floating plate will travel a predetermined distance during insertion as the floating plate slides past the fixed housing until the floating plate reaches a stop position and the test is conducted.

DETAILED DESCRIPTION

Figure 1:
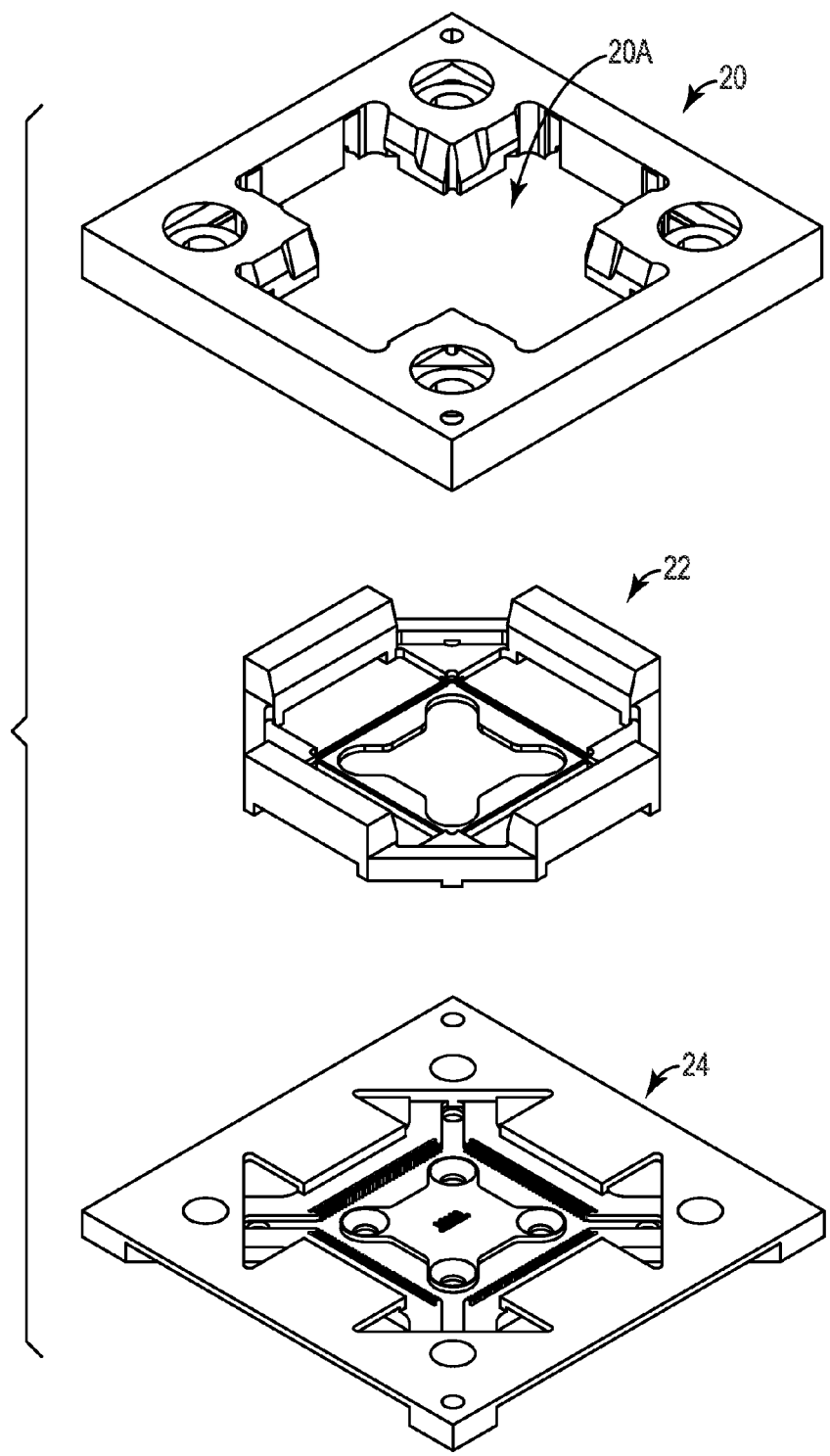
FIG. 1 is an exploded perspective view from above.
Figure 2:
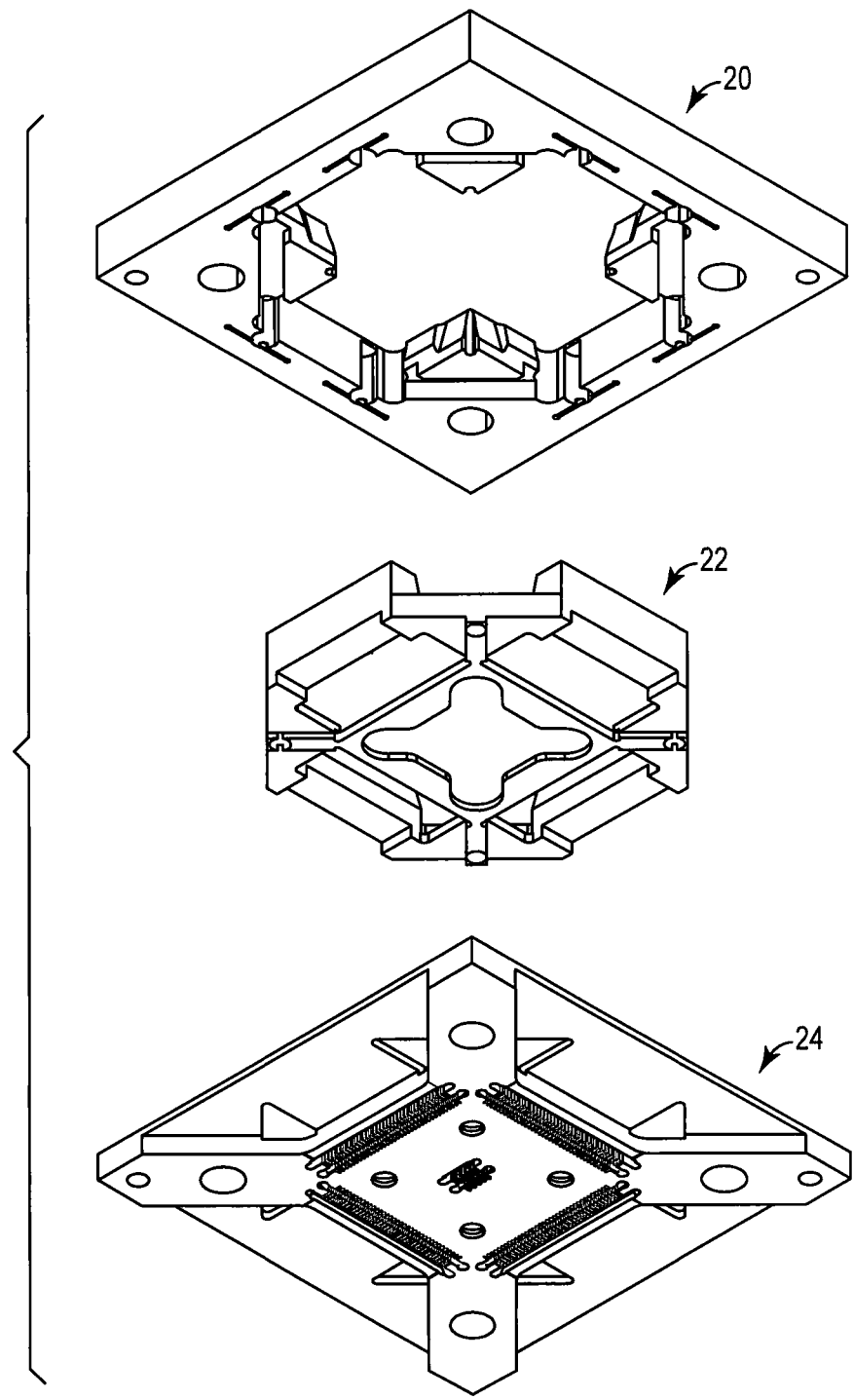
FIG. 2 is an exploded perspective view from below.
Figure 3:
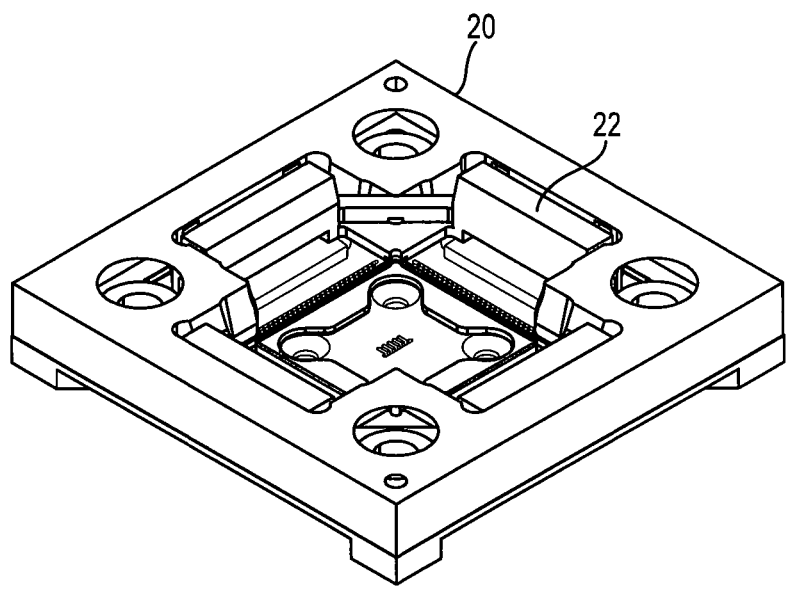
FIG. 3 is a perspective view from above assembled.
Figure 4:
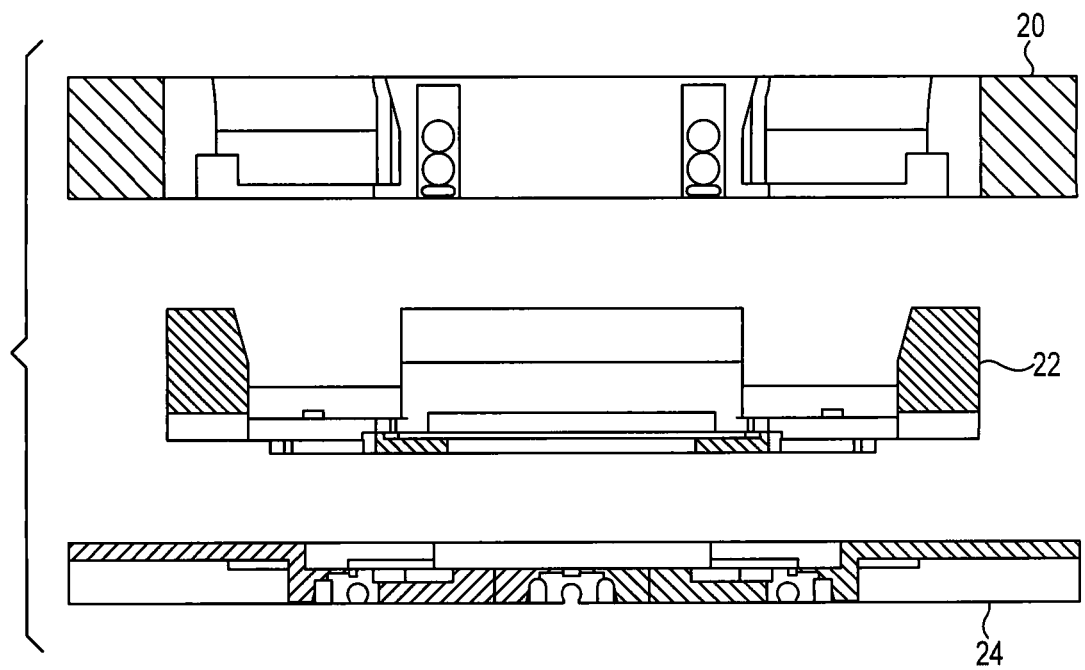
FIG. 4 an exploded side view of the fixed frame, floating plate and housing.

The following are preferred embodiments of the concepts presented. In order to solve the problem of misaligned device insertion into contactor, improper device pickup and other problems of automated handling of devices under test (DUT) to be placed in a contactor, the present disclosure details an effective solution. In the preferred embodiment a floating plate with sidewalls appropriate to the DUT resides in sliding relation within the boundaries of a fixed plate. A housing with the appropriate electrical contacts for the DUT resides underneath both. By such construction, misaligned DUT can become realigned as it engages the floating plate and travels toward the bottom housing contact plate. This floating plate (also referred to as a compliant plate) provides both a shock absorber effecting but provides time for the DUT to settle into place and dampen vibrations. The result is fewer bent leads on the DUT and more reliable test with fewer "good" DUTs testing falsely defective.

In FIGS. 1, 2, 3, and 4, this embodiment has three primary components, a fixed frame/housing 20 having a central aperture 20A, the housing receives a floating plate 22, which together sit atop a housing 24 which contains (or leads) to contact pins which are used for the electrical test of the DUT. Not shown is an inserter robot or equivalent which has a so called "nest" which holds the DUT and which is sized to engage various parts to the fixed or floating plate. In theory the engagement points between the nest and the floating plate should be enough to insure alignment and proper insertion force, but of course, that is not always the case, hence the present disclosure.

The shape of fixed housing 20 is dictated in part by the DUT handler, size of DUT, etc. however, there are many features which help make the system work effectively. For example FIG. 5, a plurality of generally vertical sidewalls 40 slideable alignment surfaces to slideably engage like slideable generally vertical sidewalls 42 on the floating plate 22 (See FIG. 7).

In fixed plate 20 there are additional means for reducing friction when the floating plate is driven downward by the inserter carrying the DUT. Embedded in sidewalls 40 are a plurality of vertical raceways 46 which receive ball bearings 48. In the preferred embodiment each sidewall 40 has a pair of spaced apart raceways with at least one, preferably 2 or more ball bearing each. Note that the boring are shown in sidewall 40 of fixed plate 20, but can also be in sidewall 42 of floating plate 22. The raceways are borings, in the form of a "keyhole slot" or a "gap" in the boring (the ball bearing, like a key, extend beyond the periphery of the boring) in the fixed plate sidewalls 40 with the boring center spaced from the sidewall sufficiently that part of the bore removes part of the sidewall but allows the ball bearings to partially protrude from the gap formed in the incomplete semicircular boarding without the bearings being able to freely escape (fall out). Geometrically, the center point of the bore must be closer to the sidewall than the radius of the bore do that more than 180 degrees of the bore circumference is within side wall material. In other words the ball bearings are exposed thru the sidewall but retained in the race because less than half of the bore circumference is open. In practice about 30-49%, particularly 33% is open. Note that is possible to locate the bearings at various locations along the peripheral interface between the fixed and floating frames 20, 22 such as in the corners rather than between the corners as shown.

Figure 5:
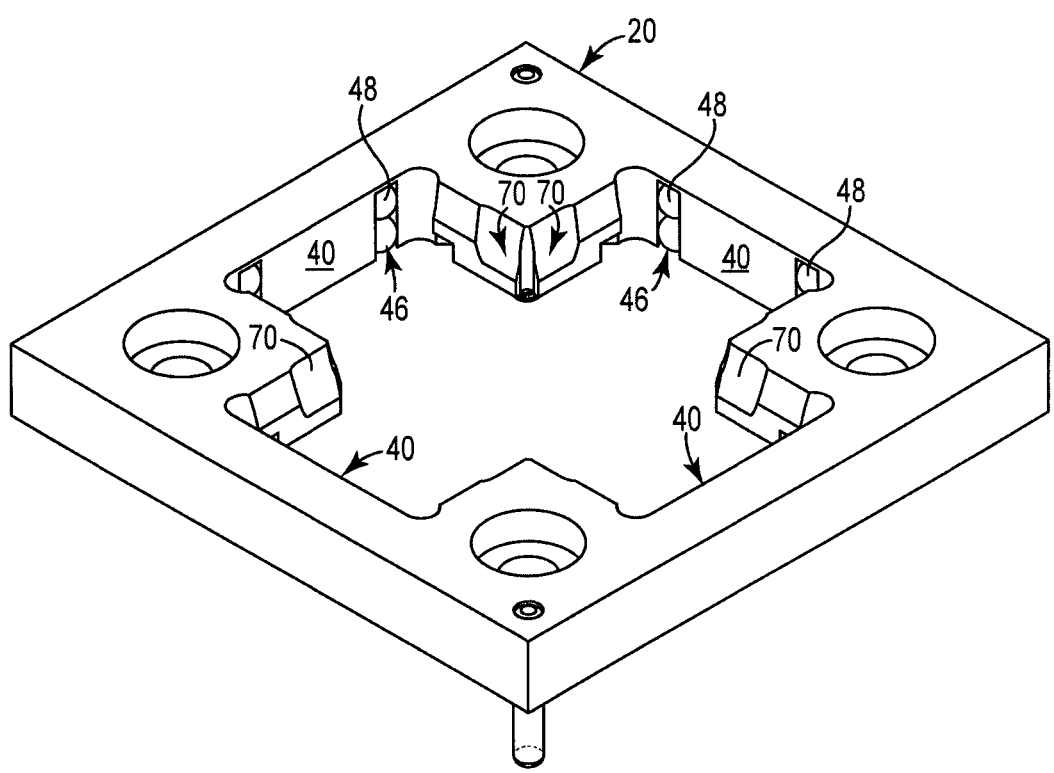
FIG. 5 is a perspective view from above of the fixed frame element.
Figure 7:
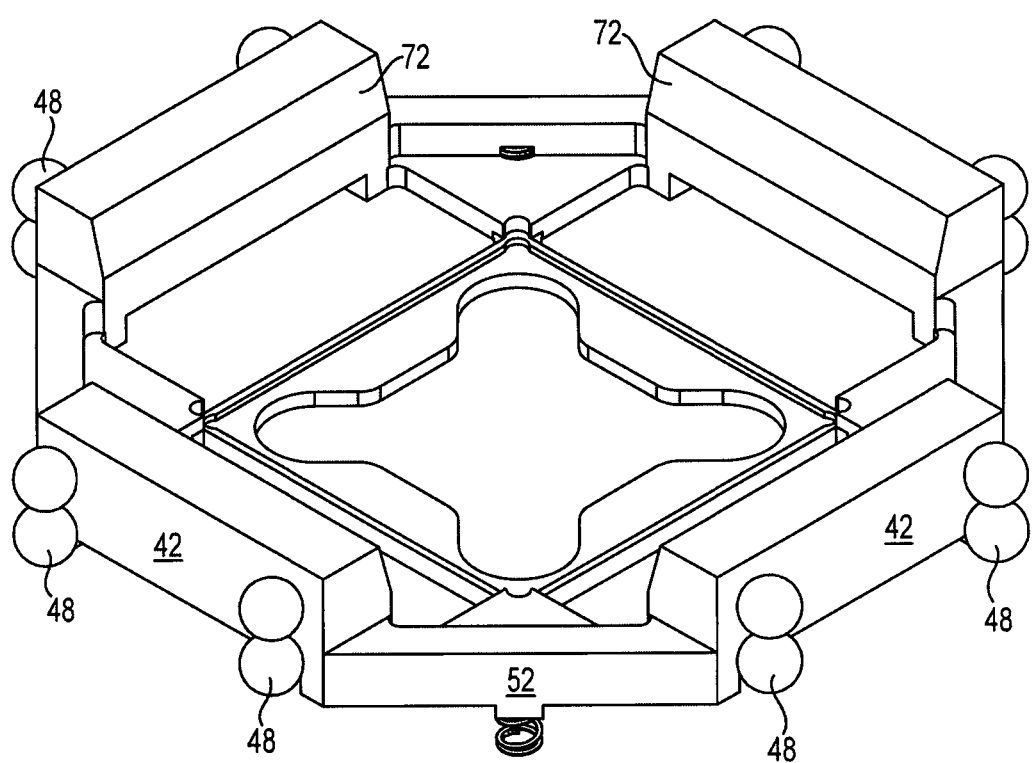
FIG. 7 is a top perspective view of the floating plate and bearing.

FIGS. 5 and 7 show chamfered sidewalls 70 and 72 respectively. These sidewalls 72 have a slope or chamfer to assist the nest in being guided into proper placement.

Figure 6:
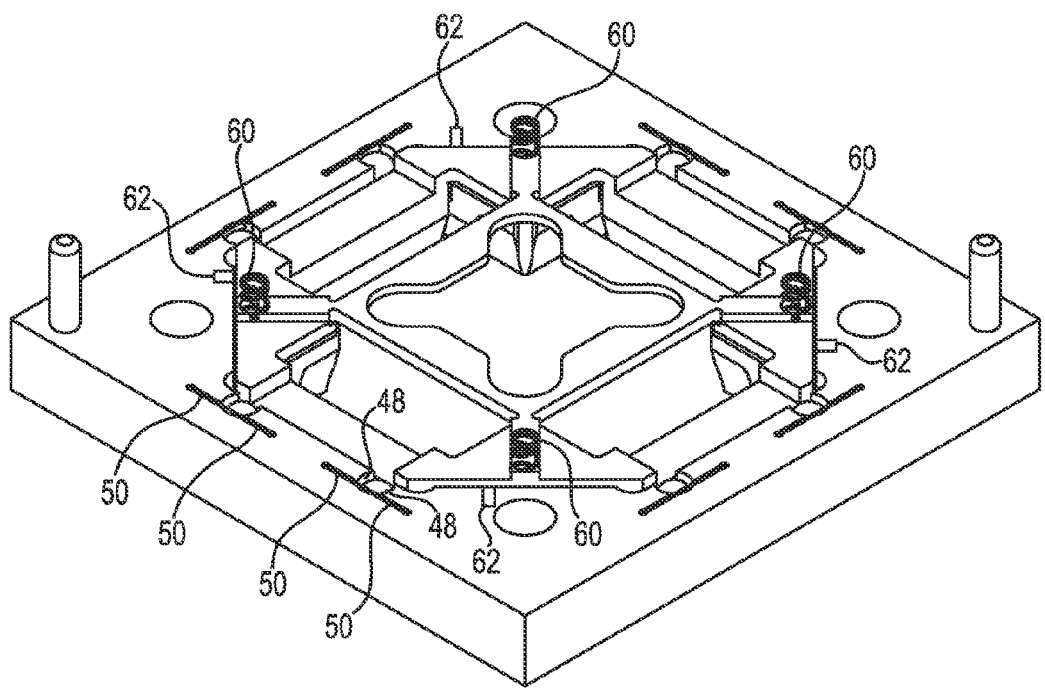
FIG. 6 is a perspective view from below the floating plate and fixed plate with the housing removed.

As shown in FIG. 6, a special technique is preferred to hold the ball bearings 48 in place so they don't fall out during assembly and to provide engagement bias regardless of their diameter. Bisecting the boring on the side opposite of the gap is a slot 50 which extends beyond somewhat tangentially from the boring periphery. This slot is either tangential or bisects the opening and is then filled with a closure or spanning element or bearing stops 52 which bias the bearings against the gap so that they don't fall out and are preferably of an elastomeric material which partially fills the slot. At the same time, it is possible to insert the ball bearing through the space between the spanning element and the boring gap and be fully retained but able to roll and perform their friction reducing function.

In this embodiment, the floating plate 22 is guided within the fixed plate 20 by 8 surfaces, the four surfaces 42 which contact bearings 48 and four more surfaces 52 (FIG. 7) which are not shown with bearings but can optionally have them. Surfaces 42 and 52 in this embodiment form an octagon which minimizes binding of surfaces due to crooked insertion. Other shapes are of course possible having more or less corners than 8 and which may be round, oval or similar.

To maintain the floating plate in an upwardly biased and "floating" state, a plurality of bias elements, in this case springs 60 are inserted in borings in the floating plate 22 preferably at it is corners or at least spaced round its periphery to apply generally equal force with minimum torque overall.

In the preferred embodiment the goal is to prevent binding of sidewalls when the nest hits one corner before the others (which is not supposed to occur in properly functioning inserters).

To prevent the bias elements 60 from causing the entire floating plate from being ejected from the fixed housing, there are elements on the fixed housing which engage and overlap the upper surface of the floating plate to stop its upward movement. Alternatively, tabs 62 (FIG. 6) can be provide on the bottom side of the floating plate for the same purpose.

Figure 8:
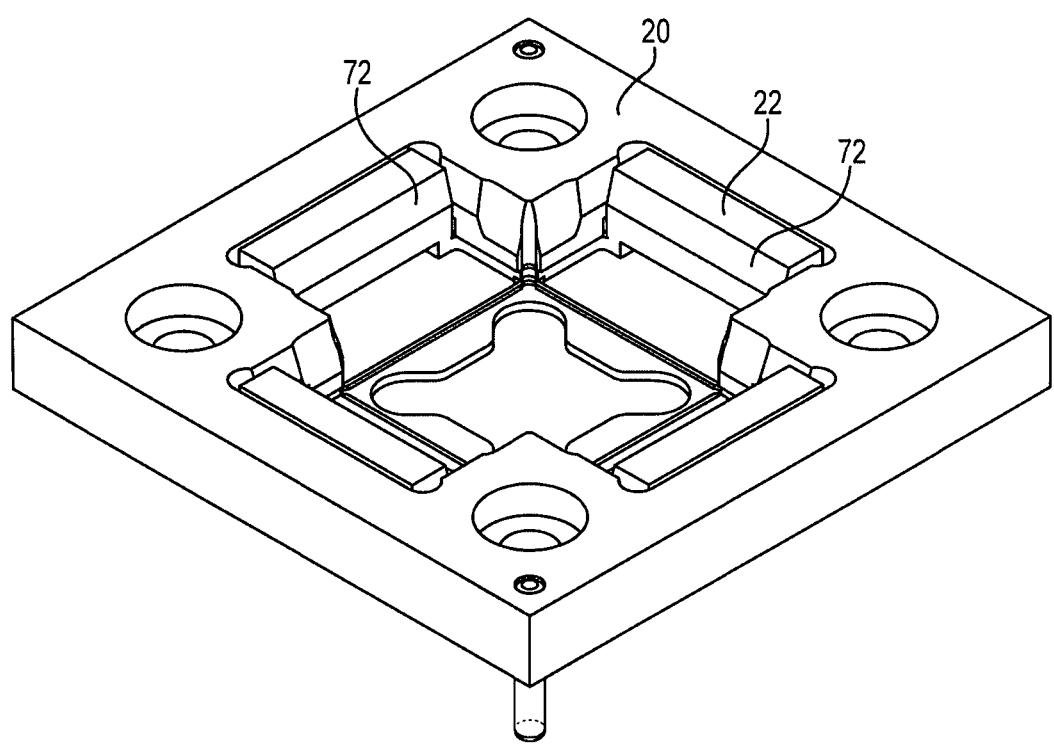
FIG. 8 is top perspective view of the fixed and floating plates with the bottom housing removed.
Figure 9:
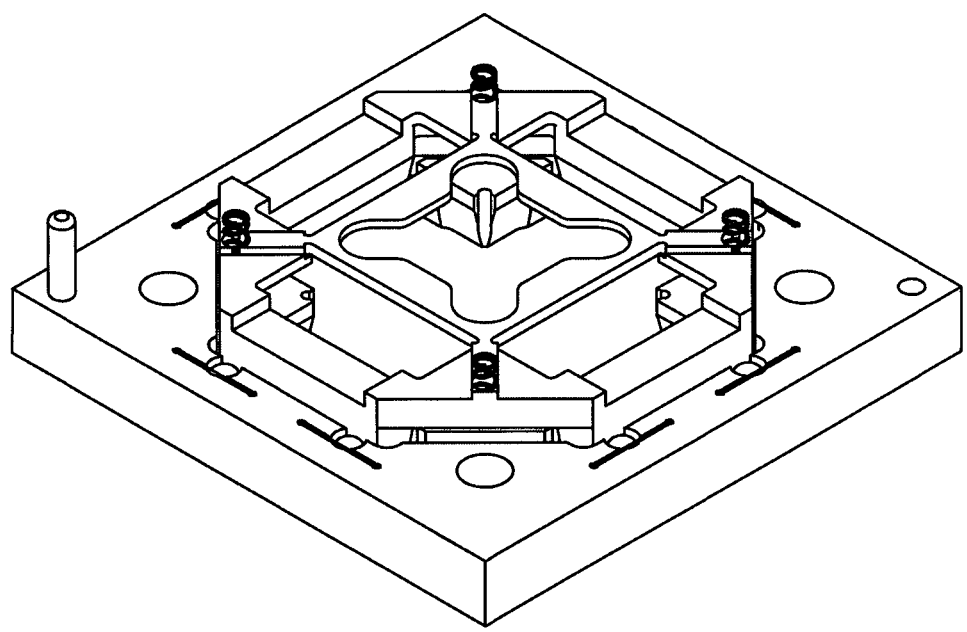
FIG. 9 is a view like FIG. 8 from the bottom.

FIG. 9 is similar to FIG. 6 except that floating plate 22 is downwardly displaced in the fixed plate, typically just after insertion. FIG. 8 is like FIG. 9 with the floating plate 22 in an upwardly extended position, in response to the bias elements 60, typically before insertion.

Figure 10:
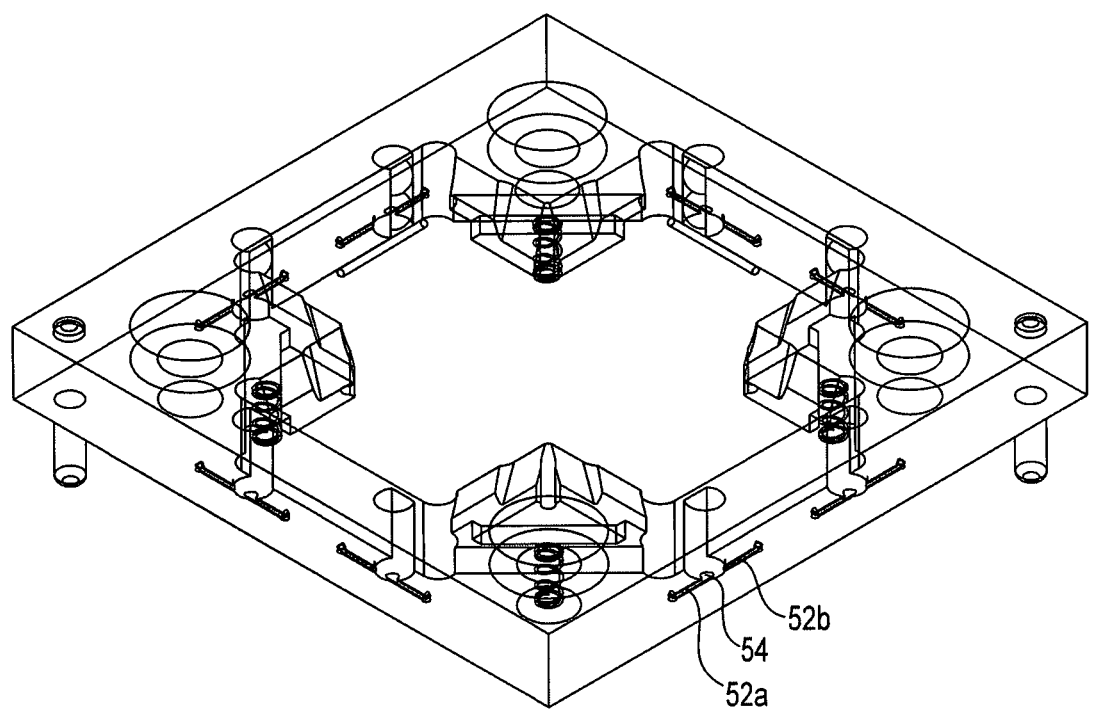
FIG. 10 is a top perspective view of the fixed plate.
Figure 11:
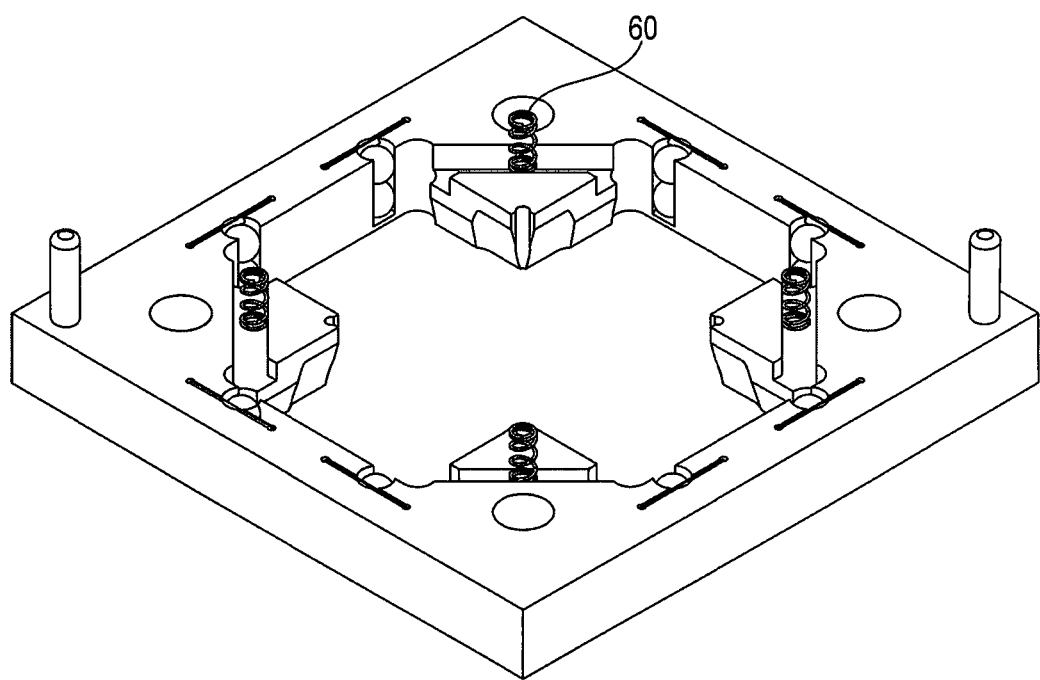
FIG. 11 is a view like FIG. 5 except from the bottom.

FIG. 10 shows a wire line view with an alternative form of ball spanning elements or bearing stops 52a, 52b. In this case the stops are separated and extend only partway into the boring but do not span it. This makes insertion of the ball bearing easier. It is also possible to add orthogonal tangs of bulbous ends 54 to the stops so that more of the boring is occluded.

Figure 12:
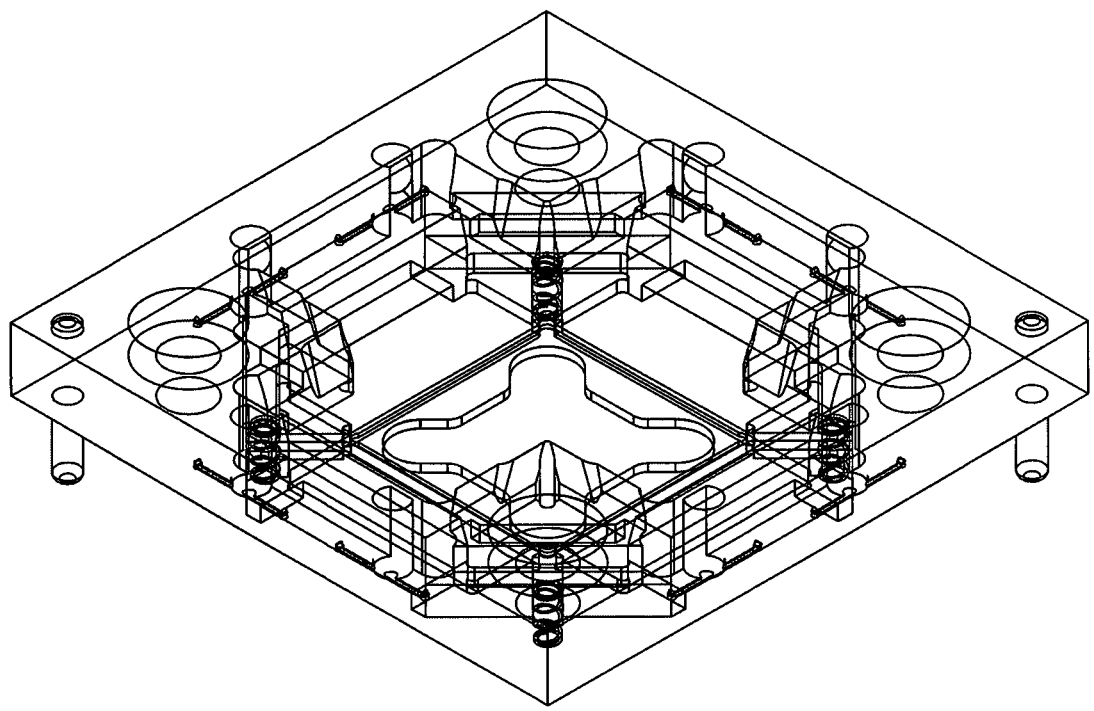
FIG. 12 is a wire-line top perspective view of the fixed and floating plates with the housing removed.

FIG. 12 also shows a wire line view like FIG. 10 except that the floating plate 22 is visible.

This description of the structure also contains a method of manufacture and method of minimizing alignment and force insertion errors of a DUT into a test socket.

The description of the invention and its applications as set forth herein is illustrative and is not intended to limit the scope of the invention. Variations and modifications of the embodiments disclosed herein are possible, and practical alternatives to and equivalents of the various elements of the embodiments would be understood to those of ordinary skill in the art upon study of this patent document. These and other variations and modifications of the embodiments disclosed herein may be made without departing from the scope and spirit of the invention.

I claim:

1. A floating plate test socket for testing microcircuit devices under test (DUT) comprising:
   a. a fixed housing having a central aperture and sidewalls bounding said aperture;
   b. a floating plate sized to be received at least in part by said central aperture and having at least two opposing sidewalls having mating surfaces which mate with like sidewalls of said fixed housing;
   c. friction reducing elements in either of said sidewalls to enhance slideability with said plate said friction reducing elements comprising:
      1. at least one bore in the sidewall of either the fixed housing or the floating plate and,
      2. a least one bearings in said bore;
   d. at least one bias element engaging said floating plate to bias said floating plate upwardly toward said fixed plate.

2. The socket of claim 1, wherein said bore extends only partly into the mating surface so that the bore forms a discontinuous gap on the mating surface so that the bearing protrudes partly beyond the bore.

3. The socket of claim 2, wherein said bore forms a semi-circular opening in the mating surface.

4. The socket of claim 2, wherein said bore forms a semi-circular opening in the mating surface which comprises less than one half of the bore, so that the bearings are retained in the bore but contact an adjacent mating surface.

5. The socket of claim 2, wherein said bore forms a semi-circular opening in the mating surface which comprises generally 30-49% of the bore, so that the bearings are retained in the bore but may contact an adjacent mating surface.

6. The socket of claim 1 including a bearing stop element partially intersecting the bore to retain the bearing.

7. The socket of claim 6, wherein said bearing stop includes an elastomeric material which intersects the bore so that the bearings are retained in the bore.

8. The socket of claim 6, wherein the bearing stop includes a pair of elasteromeric members which intersect the bore from different sides of the bore to retain the bearings in the bore.

9. A method for absorbing the shock of insertion of a microcircuit device under test (DUT) when inserted into a DUT tester having:
   a. a fixed housing having a central aperture and sidewalls bounding said aperture and;
   b. a floating plate sized to be received at least in part by said central aperture and having at least two opposing sidewalls having mating surfaces which mate with like sidewalls of said fixed housing;
   comprising the steps of:
   locating friction reducing elements in each sidewall between sidewalls of the fixed housing and floating plate,
   locating spring bias elements under the floating plate,
   so that the DUT inserted into the floating plate will travel a predetermined distance downwardly during insertion as the floating plate slides past the fixed housing until the floating plate reaches a stop position and the test is conducted.

* * * * *